(12) United States Patent
Jeong

(10) Patent No.: US 7,336,558 B2
(45) Date of Patent: Feb. 26, 2008

(54) SEMICONDUCTOR MEMORY DEVICE WITH REDUCED NUMBER OF PADS

(75) Inventor: Woo-Seop Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/264,512

(22) Filed: Oct. 31, 2005

(65) Prior Publication Data

US 2006/0092754 A1 May 4, 2006

Related U.S. Application Data

(60) Provisional application No. 60/624,295, filed on Nov. 2, 2004.

(51) Int. Cl.
*G11C 8/00* (2006.01)
(52) U.S. Cl. .................. 365/233; 365/233; 365/230.01
(58) Field of Classification Search ........... 365/230.01, 365/233, 233.5
See application file for complete search history.

(56) References Cited

U.S. PATENT DOCUMENTS

| | | | |
|---|---|---|---|
| 6,192,003 B1 * | 2/2001 | Ohta et al. | 365/233 |
| 6,212,126 B1 * | 4/2001 | Sakamoto | 365/233 |
| 6,496,444 B2 * | 12/2002 | Roohparvar | 365/233 |
| 6,978,402 B2 * | 12/2005 | Hirabayashi | 714/42 |
| 2003/0123319 A1 | 7/2003 | Kim | 365/233 |

FOREIGN PATENT DOCUMENTS

| | | |
|---|---|---|
| JP | 11-306796 | 11/1999 |
| KR | 10-2001-0037711 | 5/2001 |

* cited by examiner

*Primary Examiner*—Amir Zarabian
*Assistant Examiner*—Anthan T Tran
(74) *Attorney, Agent, or Firm*—Mills & Onello LLP

(57) ABSTRACT

A semiconductor memory device is provided which comprises a group of address pads and an input circuit configured to receive a first address from the address pads at a first transition of an external clock signal and a second address from the address pads at a second transition of the external clock signal.

10 Claims, 6 Drawing Sheets

SEMICONDUCTOR MEMORY DEVICE WITH REDUCED NUMBER OF PADS

RELATED APPLICATION

This application is related to U.S. Provisional Patent Application No. 60/624,295, filed on Nov. 2, 2004, the contents of which are incorporated herein in their entirety by reference.

FIELD OF THE INVENTION

This disclosure generally relates to semiconductor memory devices and, more specifically, to a semiconductor memory device capable of reducing a pad number.

BACKGROUND OF THE INVENTION

Synchronous memories, such as synchronous dynamic random access memory (SRAM), double data rate (DDR) SDRAM, Rambus DRAM, have been a main concern in recent years. Synchronous memories implement operations at higher speed than conventional memories and lead in present memory market.

Typically, memory controllers (e.g., CPU) use a combination of control signals so that the memory recognizes commands. For example, when a chip selection signal or a write enable signal is enabled, the memory recognizes it as a write command to perform a write operation. External control signals transmitted from a memory controller to the memory include a chip selection signal, a write enable signal, a column address strobe signal, a row address strobe signal, a clock enable signal, and the like. Since a command is generated by a combination of these external control signals, generally, these control signals are called a command signal. In addition to the command signals, address signals for assigning memory cells are required to perform a read/write operation.

In a normal read/write operation of an SDRAM, as shown in FIG. 1, a memory is provided with a row address together with an active command (consisting of a combination of external control signals), and then provided with a column address together with a read/write command. A test operation is carried out in the same way as a normal read/write operation. That is, the test operation requires command signals and address signals. Generally, the number of pads for receiving address signals is greater in number than that for receiving command signals.

As described above, the test operation needs all pads that are required in the normal read/write operation, which acts as a test limitation factor. For instance, a tester comprises a predetermined number of channels. For this reason, if the number of pads of a memory under test is large, the number of memories that are tested at the same time is decreased. This limitation can be overcome by reducing the number of pads that are required in the normal read/write operation and the test operation.

SUMMARY OF THE INVENTION

It is, therefore, a feature of the present invention to provide a semiconductor memory device capable of reducing a pad number.

In one aspect of the present invention, a semiconductor memory device is provided which comprises a group of address pads and an input circuit configured to receive a first address from the address pads at a first transition of an external clock signal and a second address from the address pads at a second transition of the external clock signal.

In an exemplary embodiment, the first and second addresses constitute either one of row and column addresses for selecting memory cells.

In an exemplary embodiment, the first transition is a high-low transition of the external clock signal and the second transition is a low-high transition of the external clock signal.

In an exemplary embodiment, the device further comprises an internal clock generator circuit for generating a first internal clock signal at the first transition of the external clock signal and a second internal clock signal at the second transition of the external clock signal.

In an exemplary embodiment, the input circuit receives the first address from the address pads in response to the first internal clock signal during a test mode of operation.

In an exemplary embodiment, the input circuit receives the second address from the address pads in response to the second internal clock signal during test and normal modes of operation.

In an exemplary embodiment, the device further comprises another group of address pads. The input circuit receives the first address from the other group of address pads in response to the first internal clock signal during a normal mode of operation.

In an exemplary embodiment, the input circuit comprises a first switch part for receiving the first address from the one group of address pads in response to the first internal clock signal during a test mode of operation; and a second switch part for receiving the second address from the one group of address pads in response to the second internal clock signal during test and normal modes of operation.

In an exemplary embodiment, the input circuit comprises a first switch part for receiving the first address from the one group of address pads in response to the first internal clock signal during a test mode of operation; and a second switch part for receiving the second address from the one group of address pads in response to the second internal clock signal during test and normal modes of operation, wherein the first switch part receives the first address from the other group of address pads in response to the second internal address during a normal mode of operation.

In another aspect of the invention, a semiconductor memory device is provided which includes a plurality of address pads for receiving external address signals; an internal clock generator circuit configured to generate a first internal clock signal a second internal clock signal at both edges of an external clock signal, respectively; a first switch circuit configured to receive first address signals from a part of the address pads in response to the first internal clock signal; and a second switch circuit configured to receive second address signals from the part of the address pads in response to the second internal clock signal.

In an exemplary embodiment, the first and second address signals constitute either one of row and column addresses for selecting memory cells.

In an exemplary embodiment, the first switch circuit receives the first address signals in response to the first internal clock signal during a test mode of operation.

In an exemplary embodiment, the second switch circuit receives the second address signals in response to the second internal clock signals during test and normal modes of operation.

In an exemplary embodiment, the first switch circuit receives the first address signals from the other of the address pads in response to the second clock signal during a normal mode of operation.

In an exemplary embodiment, the first switch circuit receives the first address signals before an external command is received, during a test mode of operation.

In an exemplary embodiment, the external command is one selected from a group of an active command, a read command, and a write command.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

The present invention will be described more fully hereinafter with reference to the accompanying drawings in which exemplary embodiments of the invention are shown.

Figure 1:
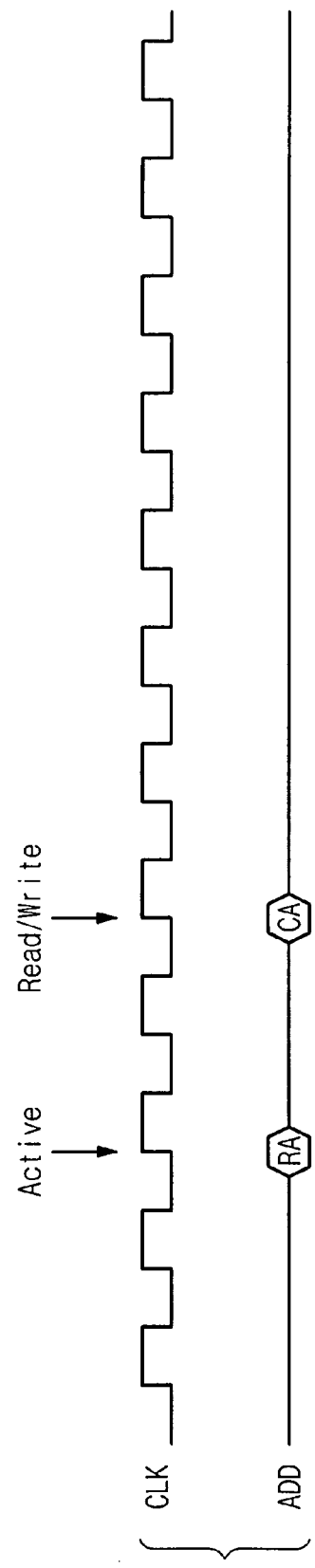
FIG. 1 is a timing diagram illustrating a read/write operation of a conventional semiconductor device.
Figure 2:
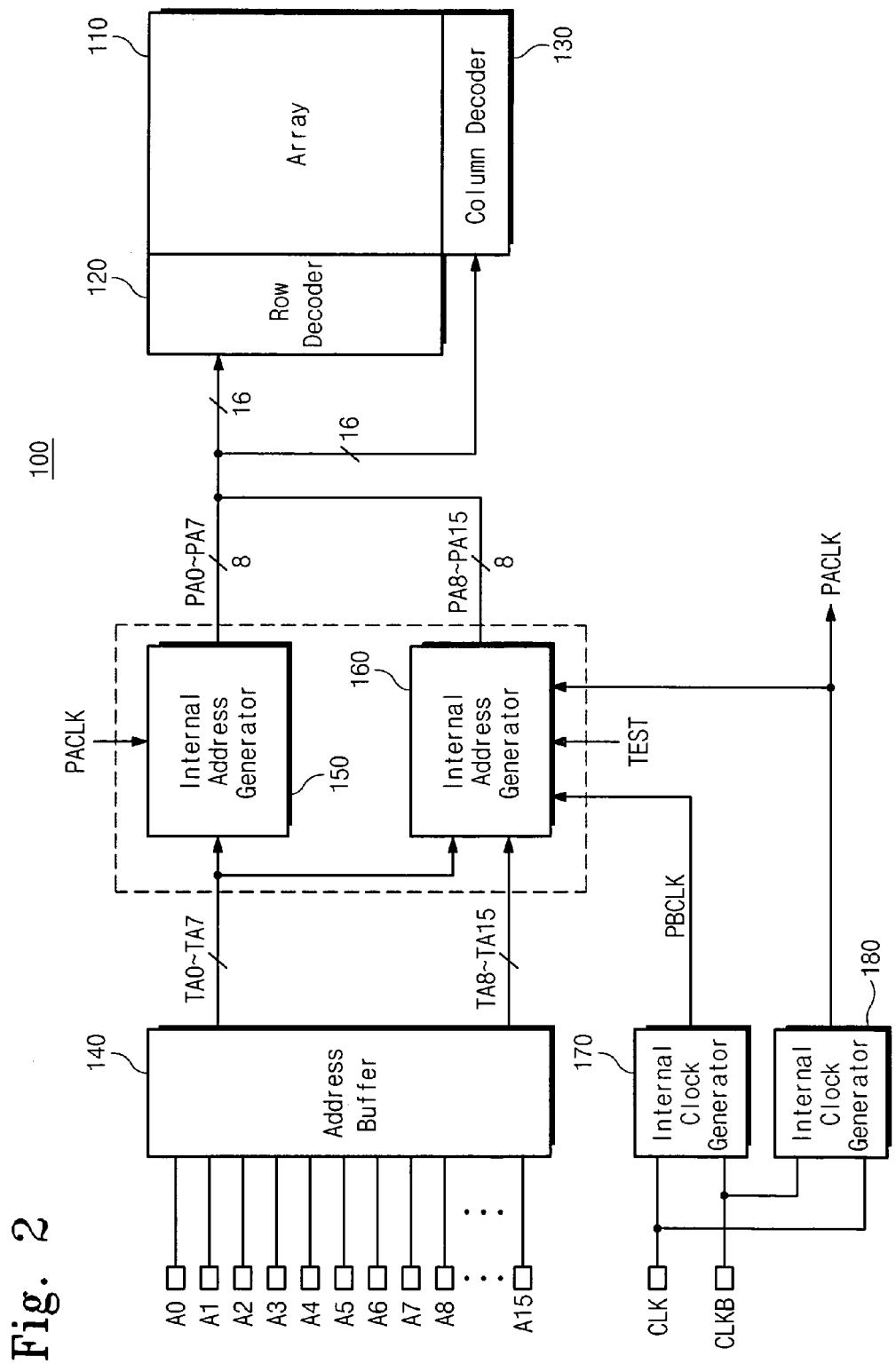
FIG. 2 is a block diagram of a semiconductor memory device according to the present invention.

FIG. 2 is a block diagram of one embodiment of a semiconductor memory device according to the present invention.

With reference to FIG. 2, a semiconductor device 100 according to the present invention includes a memory cell array 110 for storing data information. The memory cell array 110 includes memory cells (e.g., DRAM cells) arranged in rows (or word lines) and columns (or bit lines). A row decoder circuit 120 selects at least one of the rows of the memory cell array 110 in response to a row address. A column decoder circuit 130 selects a part of the columns of the memory cell array 110 in response to a column address. An address buffer circuit 140 is connected to address pads (or pins) for receiving external address signals A0-A15. A first internal address generator 150 receives address signals TA0-TA7 from the address buffer circuit 140 in response to an internal clock signal PACLK and outputs internal address signals PA0-PA7. A second internal address generator 160 receives either address signals TA0-TA7 or address signals TA8-TA15 among output signals of the address buffer circuit 140 in response to a test flag signal TEST and then outputs internal address signals PA8-PA15 in response to the internal clock signal PACLK. For example, during a test operation, the internal address generator 160 receives address signals TA0-TA7 from the address buffer circuit 140 in synchronization with an internal clock signal PBCLK. During a normal operation, the internal address generator 160 receives address signals TA8-TA15 from the address buffer circuit 140 in synchronization with the internal clock signal PACLK.

The address buffer circuit 140 and the first and second internal address generators 150 and 160 constitute an input circuit that is configured to receive an address from a part of the address pads at a first transition (a high-low transition) of an external clock signal and an address from the part of the address pads at a second transition (a low-high transition) of the external clock signal.

With reference to FIG. 2, first and second internal clock generators 170 and 180 are respectively connected to clock pads CLK and CLKB and generate the internal clock signals PACLK and PBCLK in response to external clock signals CLK and CLKB. The internal clock signal PBCLK is in synchronization with a high-low transition of the clock signal CLK (or a low-high transition of the clock signal CLKB). The internal clock signal PACLK is in synchronization with a low-high transition of the clock signal CLK. In particular, the internal clock signal PBCLK is supplied to the internal address generator 160 in the test operation. The internal clock signal PACLK is supplied to the first and second address generators 150 and 160 and is a synchronous signal for use in the semiconductor device 100.

Figure 3:
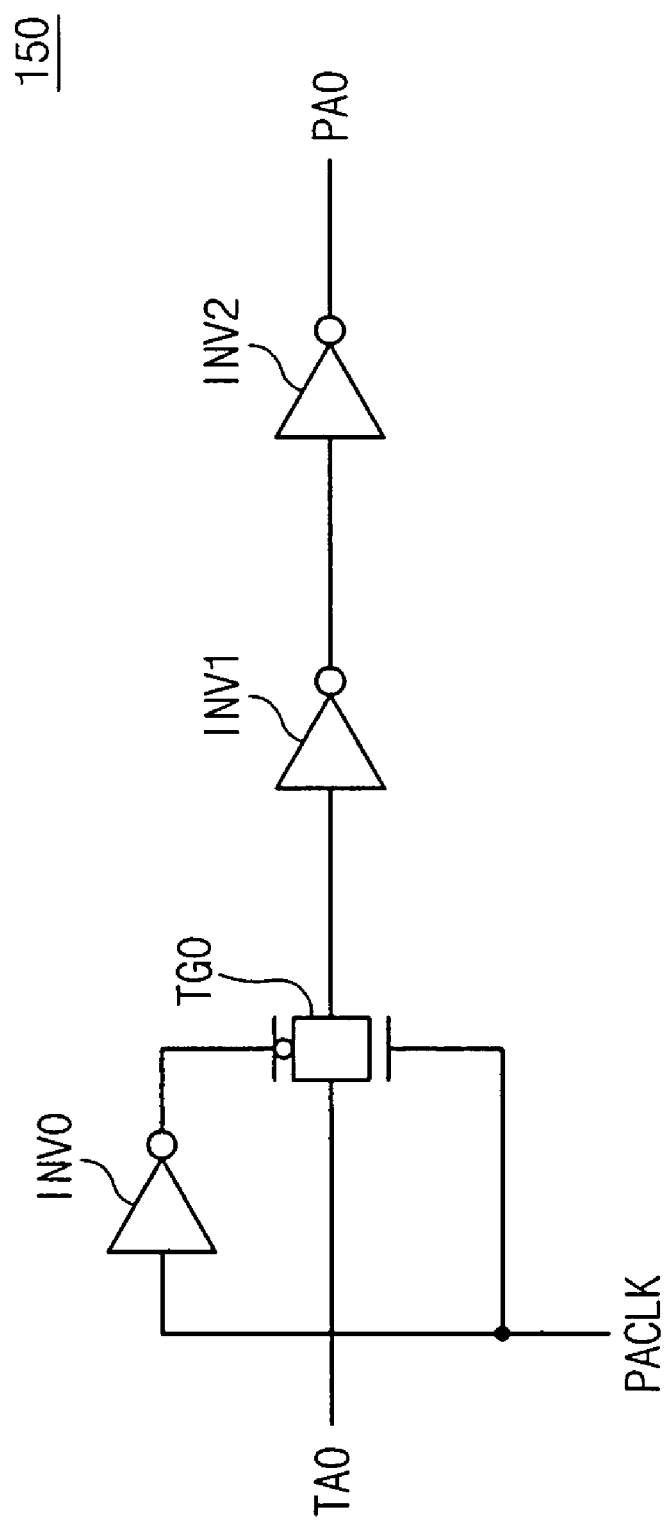
FIG. 3 is a circuit diagram of an internal address generating circuit in FIG. 2 according to a preferred embodiment of the present invention.

FIG. 3 is a circuit diagram of the first internal address generator 150 in FIG. 2 according to a preferred embodiment of the present invention.

Referring to FIG. 3, the internal address generator 150 according to the present invention is related with an address signal TA0. Circuits related with the rest of the address signals have the same construction as shown in FIG. 3. The internal address generator 150 according to the present invention 150 is configured to receive an address signal TA0 in response to an internal clock signal PACLK and to output an internal address signal PA0.

In this embodiment, the internal address generator 150 acts as a switch part that receives an address from a part (A0-A7) of address pads in response to the internal clock signal PACLK during test and normal modes of operation.

Figure 4:
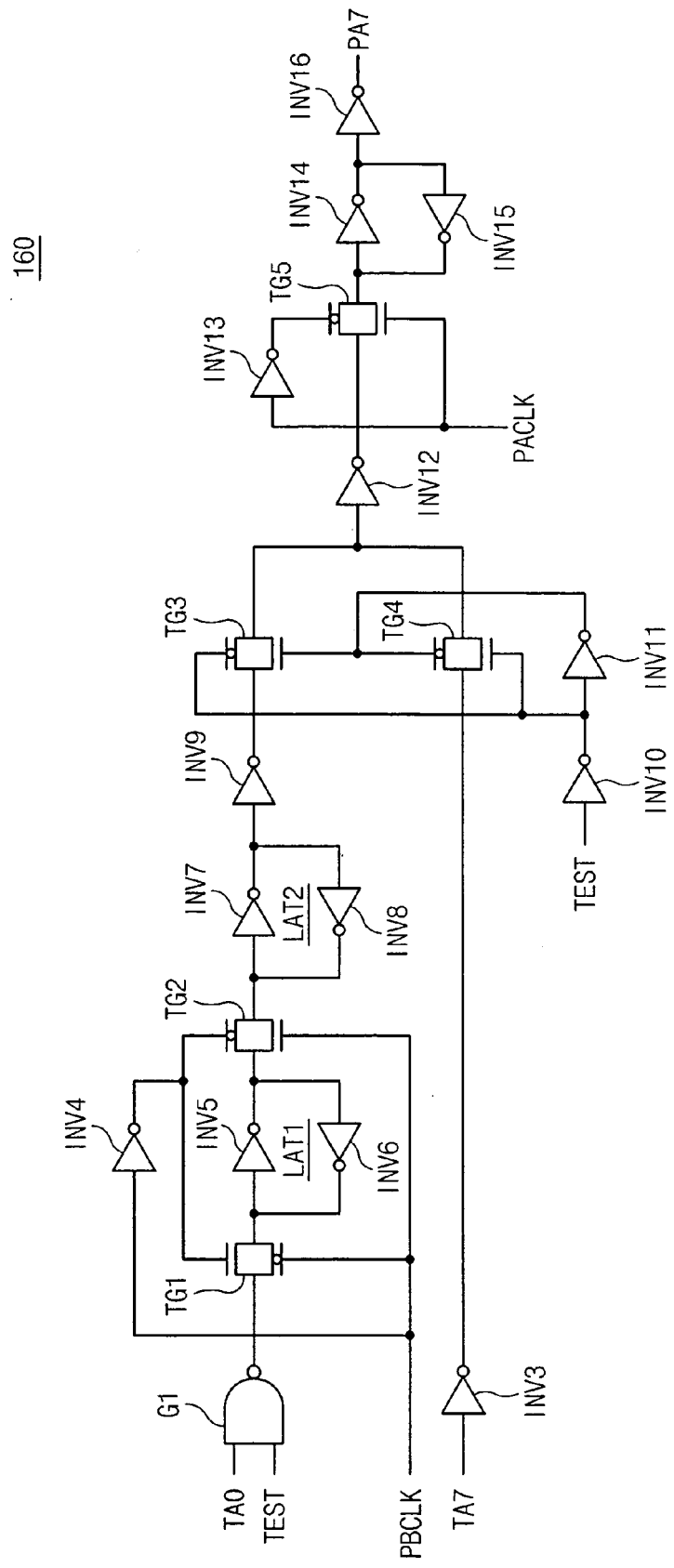
FIG. 4 is a circuit diagram of the internal address generating circuit in FIG. 2 according to a preferred embodiment of the present invention.

FIG. 4 is a circuit diagram of the second internal address generator 160 in FIG. 2 according to a preferred embodiment of the present invention.

Referring to FIG. 4, the internal address generator 160 according to the present invention is related with one address signal, and circuits of the rest of the address signals have the same construction as shown in FIG. 4. The internal address generator 160 according to the present invention is configured to receive an address signal TA0 or TA8 and output the received address signal as an internal address signal PA8, based on a mode of operation. For example, in a normal operation mode where a test flag signal TEST is at a low level, a transmission gate TG3 does not conduct while a transmission gate TG4 conducts. This means that during the normal mode of operation, an address signal TA8 is selected as the internal address signal TA8 instead of an address signal TA0. The internal address generator 160 outputs an input address signal as the internal address signal PA8 in synchronization with an internal clock signal PACLK. In a test operation where the test flag signal TEST is at a high level, the transmission gate TG3 conducts while the transmission gate TG4 does not conduct. This means that the internal address generator 160 receives an address signal TA0 in synchronization with the internal clock signal PBCLK and outputs the received address signal as the internal address signal TA8 in synchronization with the internal clock signal PACLK.

In this embodiment, the internal address generator 160 acts as a switch part that receives an address from a part of address pads in response to the internal clock signal PBCLK during a test mode of operation and receives an address from the other of the address pads in response to an internal clock signal PACLK during a normal mode of operation.

Figure 5:
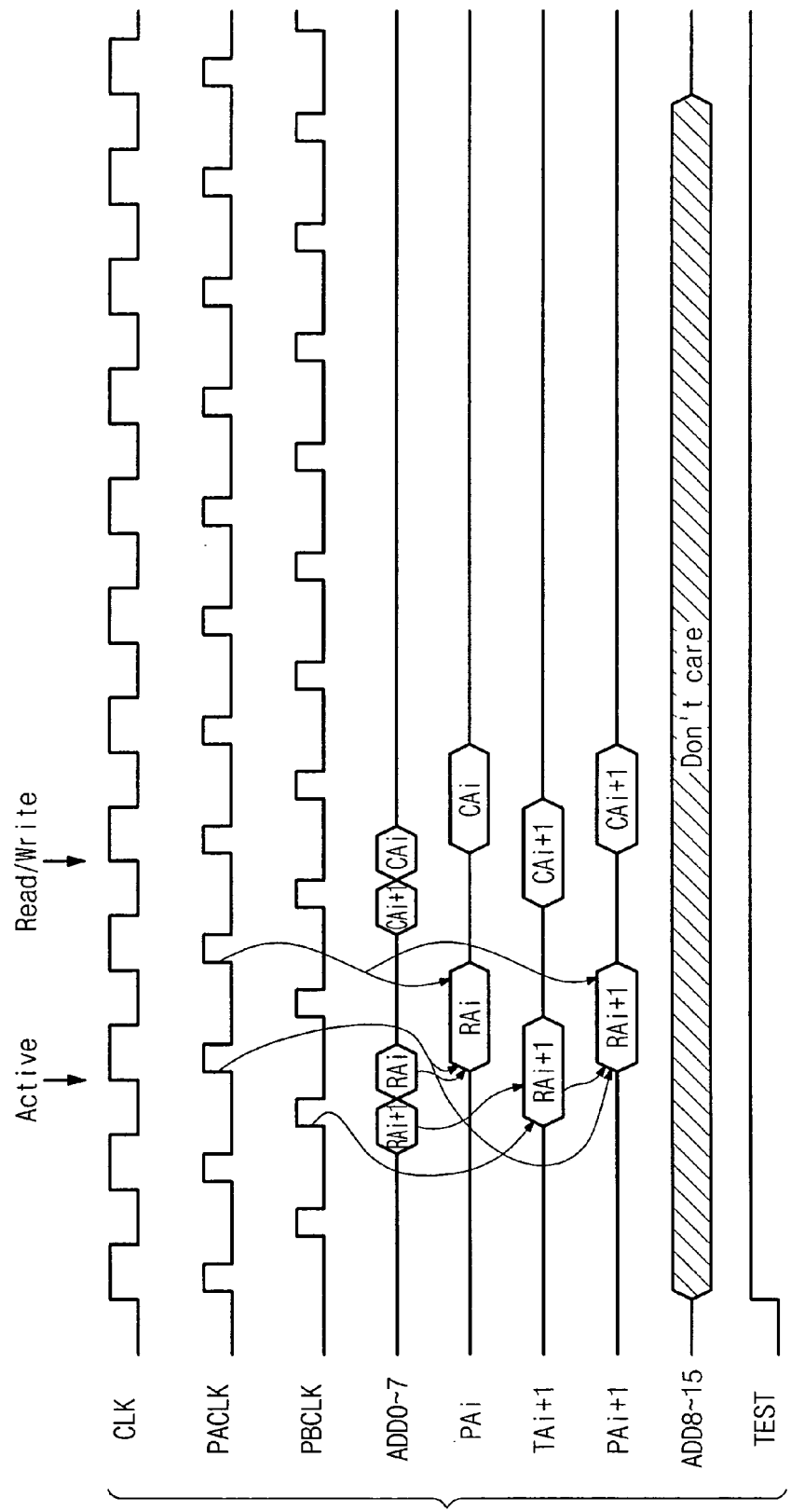
FIG. 5 is a timing diagram illustrating an operation of a semiconductor memory device according to the present invention when a test operation is carried out.

FIG. 5 is a timing diagram for describing an operation of the present semiconductor memory device. The test operation of the semiconductor device according to the present invention will be more fully described with reference to accompanying drawings.

In the same way as a normal operation, a series of active and read/write commands are inputted to the semiconductor memory device 100 so as to access memory cells at the test operation.

When the active command is inputted, an input circuit receives a row address through address pads in response to the clock signal CLK. Likewise, when the read/write command is inputted, the input circuit receives a column address through the address pads in response to the clock signal CLK. In the event that the semiconductor device according to the present invention enters a test mode of operation, a row address is received by use of a part of address pads. Likewise, a column address is received by use of the part of address pads. That is, a row/column address is divided into at least tow address segments. One of two address segments is received before an active/read/write command is provided, and the other is received when the active/read/write command is provided. This will be more fully described below.

Once the present semiconductor memory device 100 enters a test mode of operation, a test flag signal TEST is set to a high level. This makes a second internal address generator 160 receive address signals TA0-TA7 from address pads A0-A7 instead of address signals TA8-TA15 from address pads A8-A15. When the test flag signal TEST is activated high, a TA8 transfer path of the second internal address generator 160 is blocked while a TA0 transfer path thereof is formed. That is, in the second internal address generator 160, a transmission gate TG3 conducts while a transmission gate TG4 does not conduct.

As illustrated in FIG. 5, during the test mode of operation, row address segments RAi+1 and RAi are provided via address pads A0-A7. In a previous cycle of a clock cycle where the active command is inputted, the row address segment RAi+1 provided to the address pads A0-A7 are respectively latched to corresponding latches LAT1 of the second internal address generator 160 at a high-low transition of a clock signal CLK (that is, in response to an internal clock signal PBCLK). Then, the row address segment RAi provided to the address pads A0-A7 are respectively latched to corresponding latches LAT0 of the first internal address generator 150 at a low-high transition of a clock signal CLK (that is, in response to an internal clock signal PACLK). The latched address signals in the first internal address generator 150 are outputted as internal address signals PA0-PA7 (PAi). At the same time, the latched address signals in the second internal address generator 160 are outputted as internal address signals PA8-PA15 (PAi+1) in synchronization with the internal clock signal PBCLK. Likewise, column address segments CAi+1 and CAi are received as internal address signals in the same way as described above.

Figure 6:
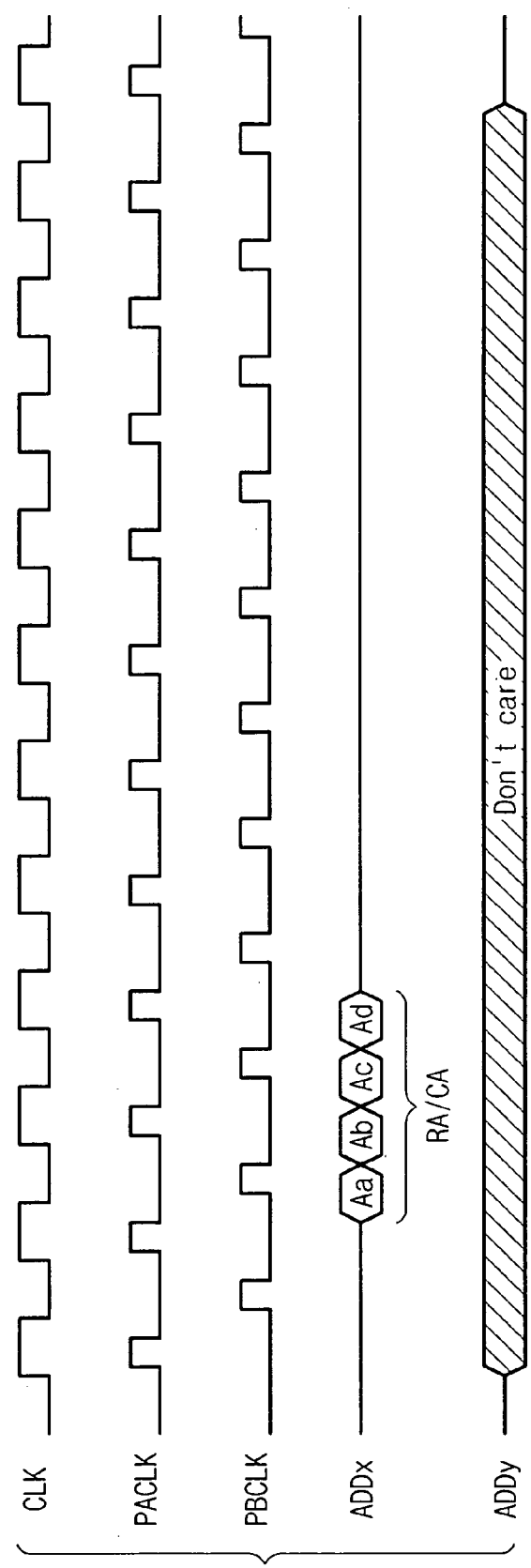
FIG. 6 is a timing diagram illustrating an address input procedure according to other embodiment of the present invention.

In accordance with the above description, a row/column address is divided into two address segments. But, it is obvious to ones skilled in the art that a row/column address can be divided into three or more address segments. For example, as illustrated in FIG. 6, a row/column address is divided into four address segments Aa, Ab, Ac, and Ad. In this case, an active, a read and a write command can be provided with one selected from a group of the address segments. In a case where a row/column address is divided into four address segments, address pads are also divided into four parts and row/column segments are received by use of one of four parts of address pads.

As well known in above-mentioned explanation, address signals required in the test operation are provided through a part of address pads (e.g., a half of address pads) into the semiconductor memory device. Accordingly, it is possible to reduce the number of address pads or pins required to perform the test operation. Although an embodiment for reducing address pads in the present invention, it is clearly understood that command pads can be reduced in the same way. Furthermore, the technical idea of the present invention is not limited to semiconductor memory devices.

As previously described, it is possible to reduce address pads in half by inputting address signals in a time-share. As a result, a memory device can be tested with a small number of a channel. That is, a number of a memory device to be tested can be increased with the same number of channel.

While this invention has been particularly shown and described with references to preferred embodiments thereof, it will be understood by those skilled in the art that various changes in form and details may be made herein without departing from the spirit and scope of the invention as defined in the appended claims.

What is claimed is:

1. A semiconductor memory device comprising:
   a group of address pads;
   an input circuit configured to receive a first address from the address pads at a first transition of an external clock signal and a second address from the address pads at a second transition of the external clock signal, wherein the first transition is one of a low-high transition and a high-low transition at a first edge of the external clock signal, and the second transition is the other of the low-high transition and the high-low transition at a second edge of the external clock signal, the second transition immediately following the first transition; and
   an internal clock generator circuit for generating a first internal clock signal at the first transition of the external clock signal and a second internal clock signal at the second transition of the external clock signal, wherein the input circuit receives the second address from the address pads in response to the second internal clock signal during test and normal modes of operation; wherein:
   the semiconductor device further comprises another group of address pads; and the input circuit comprises:
   a first switch part for receiving the first address from the one group of address pads in response to the first internal clock signal during a test mode of operation; and
   a second switch part for receiving the second address from the one group of address pads in response to the second internal clock signal during test and normal modes of operation, wherein the first switch part receives the first address from the other group of address pads in response to the second internal address during a normal mode of operation.

2. The semiconductor memory device of claim 1, wherein the first and second addresses constitute either one of row and column addresses for selecting memory cells.

3. The semiconductor memory device of claim 1, wherein the first transition is the high-low transition of the external clock signal and the second transition is the low-high transition of the external clock signal.

4. The semiconductor memory device of claim 1, wherein the input circuit receives the first address from the address pads in response to the first internal clock signal during a test mode of operation.

5. The semiconductor memory device of claim 1, wherein the input circuit receives the first address from the other group of address pads in response to the first internal clock signal during a normal mode of operation.

6. A semiconductor memory device comprising:
a group of address pads;
an input circuit configured to receive a first address from the address pads at a first transition of an external clock signal and a second address from the address pads at a second transition of the external clock signal; and
an internal clock generator circuit for generating a first internal clock signal at the first transition of the external clock signal and a second internal clock signal at the second transition of the external clock signal, wherein the input circuit receives the second address from the address pads in response to the second internal clock signal during test and normal modes of operation; wherein:
the semiconductor device further comprises another group of address pads; and the input circuit comprises:
a first switch part for receiving the first address from the one group of address pads in response to the first internal clock signal during a test mode of operation; and
a second switch part for receiving the second address from the one group of address pads in response to the second internal clock signal during test and normal modes of operation, wherein the first switch part receives the first address from the other group of address pads in response to the second internal address during a normal mode of operation.

7. The semiconductor memory device of claim 6, wherein the first and second addresses constitute either one of row and column addresses for selecting memory cells.

8. The semiconductor memory device of claim 6, wherein the first transition is a high-low transition of the external clock signal and the second transition is a low-high transition of the external clock signal.

9. The semiconductor memory device of claim 6, wherein the input circuit receives the first address from the address pads in response to the first internal clock signal during a test mode of operation.

10. The semiconductor memory device of claim 6, wherein the input circuit receives the first address from the other group of address pads in response to the first internal clock signal during a normal mode of operation.

* * * * *